United States Patent [19]

Fisher et al.

[11] Patent Number: 4,498,073
[45] Date of Patent: Feb. 5, 1985

[54] KEYBOARD WITH SIMULTANEOUS OPERATIONS

[76] Inventors: Charles B. Fisher, 2850 Hill Park Rd., Montreal, Quebec, Canada, H3H 1T1; Sidney T. Fisher, 400 Prince Arthur, Montreal, Quebec, Canada

[21] Appl. No.: 559,031

[22] Filed: Dec. 7, 1983

[51] Int. Cl.³ ............................................. G08C 9/00
[52] U.S. Cl. ............................ 340/365 S; 340/365 R; 364/709; 400/479; 178/17 C; 179/90 K
[58] Field of Search ............ 340/365 E, 365 S, 365 R, 340/365 C, 365 VL; 364/709; 179/90 K; 178/17 C; 400/479

[56] References Cited

U.S. PATENT DOCUMENTS 3,225,883  12/1965  Ayres ............................. 340/365 R

FOREIGN PATENT DOCUMENTS 1492538  11/1977  United Kingdom ............ 340/365 R Primary Examiner—Donnie L. Crosland

[57] ABSTRACT

A keyboard in which, when one of the function keys is depressed simultaneously with one of the character keys, the signal generated by the depressed function key is transmitted during a first period of time following the key-stroke which depressed the keys, and the signal generated by the depressed character key is transmitted during a second period of time following the key-stroke which depressed the keys, the second period having an initial instant following the last instant of the first period. To achieve this result the character signal is delayed, so that an associated printer receives and is capable of performing the function commanded by the function signal before the printer is caused to print the character of the character signal which is subsequently received.

1 Claim, 1 Drawing Figure

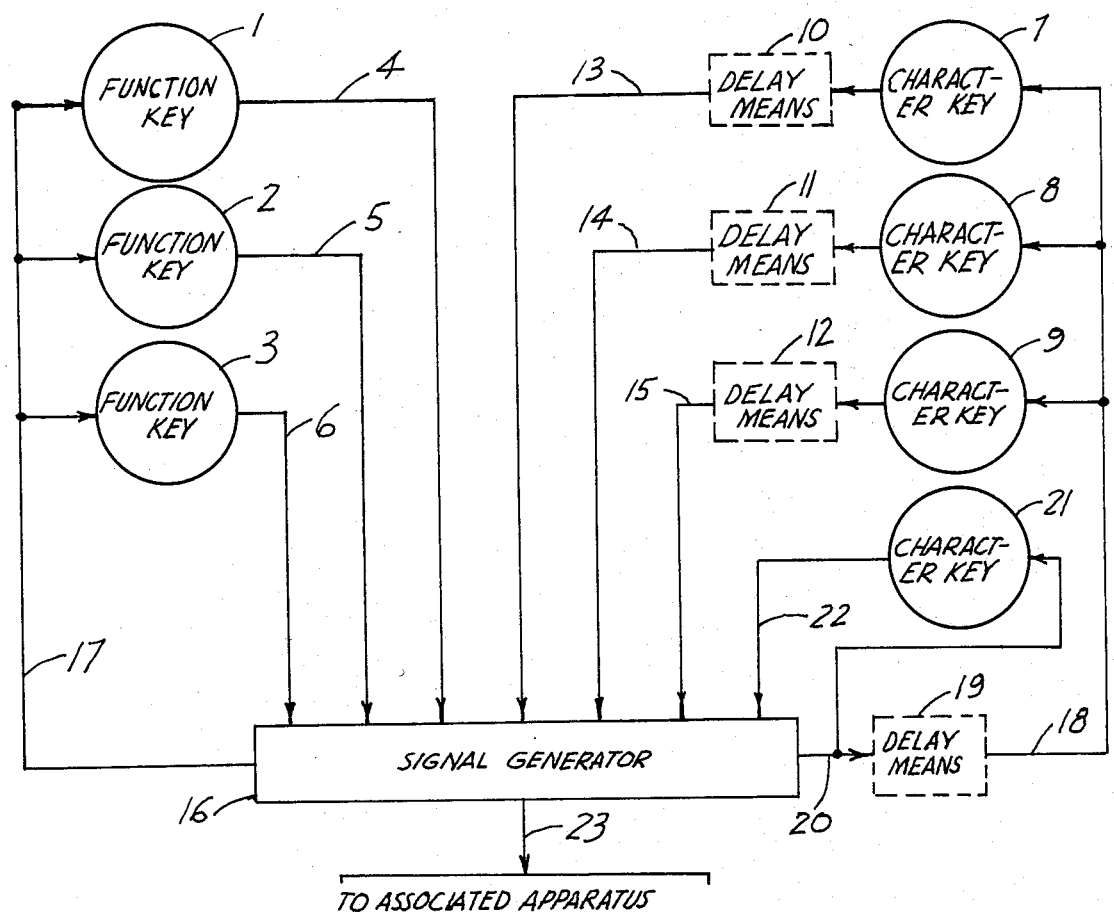

KEYBOARD WITH SIMULTANEOUS OPERATIONS

BACKGROUND OF THE INVENTION

A keyboard in which, when one of the function keys is depressed simultaneously with one of the character keys, the signal generated by the depressed function key is fully transmitted before the signal generated by the depressed character key commences to be transmitted.

In keyboards of the prior art arranged for two keys to be depressed simultaneously, as disclosed by Ayres in U.S. Pat. No. 3,225,883, and by Stewart et al in British Pat. No. 1,492,538, only character keys are depressed simultaneously, and depression of two keys simultaneously may result in a signal not related to either of the depressed keys. Thus keyboards of the prior art with conventional arrangements of keys require two key-strokes for one function followed by one character, whereas for one of several functions, followed by one character, the keyboard of this invention requires only a single key-stroke. This result is achieved by delaying transmission of character signals until an associated printer has completed the function. With simultaneous depression of the space key or bar, and one character, the keyboard of this invention reduces by about 20% the number of key-strokes required for a given text, and if the shift key and a character key are simultaneously depressed a further reduction is obtained. An untrained operator can use the keyboard in the conventional manner, and with brief training can use the improved features of the invention.

SUMMARY OF THE INVENTION

A keyboard is disclosed in which one of the function keys may be depressed simultaneously with one of the character keys, by a first key-stroke. The signal generated by the depressed function key is delivered during a first period following the first key-stroke, and the signal generated by the character key is delivered during a second period following the first key-stroke. The signal generated by the depressed character key passes through delay means, so that the initial instant of the second period follows the final instant of the first period. The initial instant of the first period to the final instant of the second period does not exceed the minimum period normally permitted between key-strokes. Associated transmission means, recording means and printer are required to be fast enough to enable completion of the function commanded by the depressed function key to be completed without effect from the signal from the depressed character key, and for the character commanded by the depressed character key to be processed without effect from a signal generated by a second key-stroke.

Thus when one of the function keys, such as the space key or bar, the shift key, or in some keyboards so equipped, the delete key, is depressed substantially simultaneously with one of the character keys, the keyboard delivers two usable signals in the time used in the prior art for one signal. The result is that the time required for transmission of a given text is typically reduced by 20 to 40%.

The keyboard may be used as a conventional keyboard by an operator untrained in the new feature. With a small amount of training the operator can use the new feature and can substantially reduce the time of transmission of a typical given text. Associated equipment such as printers is now fast enough in general use for this keyboard, and suitable mechanical, electrical and optical delay means are well known. The keyboard may transmit signals to associated apparatus over multipath mechanical, electrical or optical or single-path electrical or optical digital means.

BRIEF DESCRIPTION OF DRAWING

The drawing shows in simplified block schematic form a keyboard according to the invention.

DETAILED DESCRIPTION OF THE ILLUSTRATED EMBODIMENT

Keyboards of the prior art in general service in typewriters, teleprinters and similar apparatus are designed for operation by pressing one key at a time, or depressing one function key and retaining it depressed while other keys are depressed one at a time. These keyboards include the following well known arrangements: (1) Each key has a mechanical or electric connection to an associated printer, or recording or transmission means. (2) Each key has an electrical connection to a device which generates a digital sequence when the key is depressed, as in teleprinters, computers and similar apparatus. (3) Each key has an electric connection to logic circuits which actuates a combination of several leads to printing, recording or transmission means. The electrical connections mentioned above are replaceable by optical paths.

Delay means are well known which may be introduced into mechanical, electrical and optical connections or paths, to delay signals over these paths for periods of zero to several hundred milliseconds. Delay means are used by Stewart et al, cited above, in keyboards where combined signals are generated, to ensure that no signal is sent until all the keys intended to be depressed simultaneously are actually depressed. This is not the function of delay means in the invention.

The drawing shows a keyboard according to the invention in simplified block schematic form, which may be constructed in precisely the same manner as keyboards of the prior art, except for the addition of delay means known to the prior art, which delay the signals from character keys so that they do not overlap in time the signals from simultaneous function keys.

A plurality of function keys of which three keys are designated 1, 2, and 3 respectively is shown with connections 4, 5 and 6 respectively. There may be from one to twenty or more function keys in the plurality. Three keys of a plurality of character keys are shown and designated 7, 8 and 9, connected through delay means 10, 11 and 12 respectively to connections 13, 14 and 15 respectively. In keyboards of the prior art a greater number of character keys are often provided. The keys are digital sequences of keyboards of the prior art, which may also be used in keyboards according to this invention, are shown in Reference Data for Radio Engineers, Howard W. Sams, 1969, pages 30–40 and 30–44.

In the keyboards of this invention, as shown in the drawing, the blocks represent devices known to the prior art, and the improvement consists of delay means connected to delay signals from the character keys but not signals from one or more function keys.

In operation in a conventional manner of a keyboard according to the invention, or some keyboards of the prior art, a single key is depressed at some key-strokes, and at instants of other key-strokes a function key, such as a shift key, is depressed and held depressed during one or more subsequent key-strokes depressing other keys one at a time.

In operation of a keyboard according to the invention in an improved manner, keys may be depressed in the conventional manner. In addition, a function key such as a space, shift or delete key, and a character key, may be depressed simultaneously at an instant of a first key-stroke, by using one finger of each hand for each key. In this case the keyboard delivers the function signal during a first period of time, and because of the addition of delay means in the character signal path delivers the character signal during a second period of time, the initial instant of the second period occurring after the final instant of the first period. The final instant of the second period occurs before the delivery of any portion of any signal caused by a second key-stroke which follows next after the first key-stroke. The result is that on some key-strokes the keyboard delivers a function signal and a character signal separated in time, which may be separately recorded or may separately actuate a printer.

When this feature is used for simultaneous depression of a space key and a character key, or a shift key and a character key, with a given typical text to be transmitted, the improved keyboard requires 20% to 40% fewer key-strokes than the same text transmitted in a conventional manner on the improved keyboard or a keyboard of the prior art.

In the drawing function keys 1, 2 and 3 deliver signals to generator 16, with signal return path 17. Character keys 7, 8 and 9 deliver signals to signal generator 16, with return paths 18 and 20 in tandem. Delay means 19 may be inserted between paths 18 and 20, particularly if electric signals are generated by the character keys. In this case delay means 10, 11 and 12 are not provided, and keys 7, 8 and 9 are connected to signal generator 16 by leads 13, 14 and 15 respectively, and only delay means 19 is required for the keyboard. With mechanical signals from the keys delay means 19 is preferably omitted and delay means 10, 11 and 12 are provided. As either one of these arrangements may be used, but preferably not both, delay means 10, 11, 12 and 19 are drawn with broken lines. In some cases of a keyboard according to the invention there may be one or more character keys, such as key 21, which generate signals which are infrequently used to follow a function signal, and do not require to be delayed. These keys are connected directly to the signal generator 16, as key 21 is shown connected by leads 20 and 22.

Signal generator 16 takes several forms in the prior art, and delivers its output over output means 23 to associated apparatus as follows, in this invention:

a. In a mechanical keyboard, each key as it is depressed causes signal generator 16 to actuate output means 23, to a key bar or a function bar of an associated printer, the actuation of the key bar being delayed from the actuation of the function bar, when the character key and the function key are depressed substantially simultaneously.

b. In a digital keyboard of a first type, each key as it is depressed actuates a logic circuit in signal generator 16, which applies voltage to a different combination of output leads in a plurality, often eight in number, at output 23 of signal generator 16. The combination is different for each key, and the application of voltage to the plurality of leads is delayed, when a character key is depressed from the application of voltage when a function key is substantially simultaneously depressed.

c. In a digital keyboard of a second type, each key as it is depressed actuates a logic circuit in signal generator 16, which delivers a digital sequence to a circuit at output 23. A different sequence, often consisting of eight binary digits, is delivered for each key. The delivery of a sequence for a character key is delayed from the delivery of a sequence from a function key which is simultaneously depressed.

In each case recited, only character keys may be delayed. In the description of keyboards of the invention, a character key may infrequently or never be preceded by a function key, when certain functions, such as delete, are not provided. In this case a character signal such as comma, semicolon, question mark and exclamation mark need not be delayed, and this signal and the signal from a function key which is infrequently or never followed by a character key, may occupy the whole period from the initial instant of the first period to the final instant of the second period between two key-strokes.

As the usage is different in different arts employing keyboards, "function key" is herein used for a key which does not cause a symbol to be printed or displayed, and "character key" is used for a key which causes a symbol to be printed or displayed.

Since many changes could be made in the construction disclosed herein, and many apparently widely different embodiments of the invention could be made without departing from the scope thereof, it is intended that all matter contained in the above description or shown in the accompanying drawing shall be interpreted as illustrative only and not limiting.

We claim:

1. A keyboard which comprises:
    a first plurality of keys designated function keys, such as space, shift or delete keys, each of which when depressed by a key-stroke generates and delivers a signal which is capable of being processed and when transmitted is capable of causing associated apparatus to perform the function corresponding to said depressed function key, during a first period of time, following said depression of said function key, having initial and final instants, and
    a second plurality of keys designated character keys, such as keys for letters, numerals, punctuation points and symbols, each of which when depressed generates and delivers a signal which is capable of being processed and when transmitted is capable of causing associated apparatus to perform the character corresponding to said depressed character key, during a second period of time, following said depression of said character key, having initial and final instants;
    wherein the improvement comprises delay means, which delays delivery of said signals from at least one of said character keys, and
    said delay means, having a value of delay which, when one of said function keys is depressed simultaneously with one of said character keys by a first key-stroke, causes said initial instant of said second period of time to occur later than said final instant of said first period of time, and causes said final instant of said second period of time to occur earlier than the initial instant of a signal caused by a second key-stroke, said first and said second key-strokes occurring successively separated by the minimum interval of time permitted in operation of said keyboard with said associated apparatus, and
    means for generation of said signals from said keys in a form suitable for said associated apparatus.

* * * * *